United States Patent [19]

Bouwer

[11] Patent Number: 4,698,575
[45] Date of Patent: Oct. 6, 1987

[54] POSITIONING DEVICE

[75] Inventor: Adrianus G. Bouwer, Eindhoven, Netherlands

[73] Assignee: U.S. Philips Corporation, New York, N.Y.

[21] Appl. No.: 878,740

[22] Filed: Jun. 26, 1986

[30] Foreign Application Priority Data

Apr. 29, 1986 [NL] Netherlands ............... 8601095

[51] Int. Cl.⁴ .............................................. G05B 1/06
[52] U.S. Cl. .................................. 318/640; 318/687; 318/135
[58] Field of Search ............... 318/640, 687, 653, 135; 250/491.1, 492.1

[56] References Cited

U.S. PATENT DOCUMENTS

| 4,506,204 | 3/1985 | Galburt ............................ 318/653 |
| 4,506,205 | 3/1985 | Tront et al. ...................... 318/653 |
| 4,507,597 | 3/1985 | Tront ............................... 318/653 |
| 4,509,002 | 4/1985 | Hollis, Jr. ........................ 318/640 |
| 4,525,852 | 6/1985 | Rosenberg ..................... 250/491.1 X |

OTHER PUBLICATIONS

"DeConstructeur", magazine article of Oct. 1983, No. 10, pp. 84-87.

Primary Examiner—William M. Shoop, Jr.
Assistant Examiner—Saul M. Bergmann
Attorney, Agent, or Firm—Robert T. Mayer

[57] ABSTRACT

A positioning device comprising a first and a second support (9, 11) which are interconnected by a parallelogram mechanism of elastically deformable rods (17), the first and the second support (9, 11) together being displaceable in horizontal planes with a maintained position of the first support (9) in vertical direction, while with a maintained position of the first support (9) in a horizontal plane that support (9) is displaceable in vertical direction by means of a substantially frictionless relative displacement in horizontal direction of the second support (11) with respect to the first support (9).

The positioning device is particularly suitable for displacements of an object in the submicron range, such as, for example, in optical lithographic devices.

6 Claims, 9 Drawing Figures

POSITIONING DEVICE

The invention relates to a positioning device comprising a first upper and a second lower support, which are coupled to each other by means of at least two elastic rods acting together as a parallelogram mechanism, at least one support being displaceable parallel to itself with respect to the other support in a direction parallel to one (Y) of two coordinate directions (X, Y) of an orthogonal coordinate system (X, Y, Z) with a simultaneous elastic deformation of the rods acting as a parallelogram mechanism, which rods have a comparatively high resistance to displacement of one of the supports with respect to the other support parallel to the X-direction.

The invention further relates to an optical lithographic device provided with a positioning device according to the invention.

In a known positioning device of the kind mentioned in the opening paragraph (see the book "Lösungskataloge für Sensoren", Part I, of R. Breitinger, 1976, p. 46, ISBN 3-7830-0111-0), the upper support can be displaced with respect to the fixedly arranged lower support over a comparatively large distance parallel to the Y-direction with a simultaneous displacement over a comparatively small distance in a direction parallel to the Z-direction. For applications of the known positioning device, in which besides a displacement parallel to the Z-direction also a displacement independent thereof parallel to the X- and Y-directions should be desired, a movement of the two supports together as a whole parallel to the X- and Y-direction, respectively, is conceivable. A positioning device for the X- and Y-directions without the possibility of displacement parallel to the Z-direction is known per se from the magazine "De Constructeur" of October 1983, No. 10. In an article in this magazine (p. 84–87, see FIG. 4) of R. H. Munnig Schmidt and A. G. Bouwer, a so-called X-Y-$\phi$ table is described comprising one electric linear motor for the X-direction and two electric linear motors for the Y-direction and the $\phi$-direction.

A positioning device for displacing objects, such as semiconductor substrates, by means of which such an object can be displaced in the X- and the Y-direction as well as in the Z-direction, is known from U.S. Pat. No. 4,485,339. The displacement in the Z-direction is obtained by means of three actuators of the electrodynamic type. The displacement in the Z-direction by means of three actuators without the table or object holder being tilted is comparatively complicated and also expensive.

The invention has for its object to provide a positioning device in which the upper support can perform displacements parallel to X-, Y- and Z-directions, which are independent of each other and are obtained by comparatively simple, robust and reliable means, by which no play, friction and hysteresis are introduced.

A positioning device according to the invention is for this purpose characterized in that the second lower support is supported by means of a static bearing pre-stressed parallel to the Z-direction and comprising a viscous carrier medium and is guided with respect to a base and is provided with a Z-actuator which cooperates with the first upper support, the upper support being displaceable in a first mode of operation of the Z-actuator by means of a first and a second drive which is independent from the first drive, respectively, parallel to the X-direction and the Y-direction to an X-Y target position with an activated Z-actuator, while the upper support in a second mode of operation of the Z-actuator is displaceable parallel to the Z-direction and is maintained in the said X-Y target position by the first and second drives during a displacement parallel to the Y-direction of the lower support with respect to the upper support. Due to the fact that for displacements of the upper support parallel to the Z-direction the actuator pushes itself in the lower support away parallel to the Y-direction with respect to the upper support and the lower support experiences a minimum resistance owing to the aerostatic bearing, the upper support can be held in a simple manner in the target position with regard to the X-direction and the Y-direction.

A particular embodiment of the positioning device, by which in a comparatively simple manner a stable and torsionally stiff supporting of the upper support and also a coupling of this support with the lower support are obtained, is further characterized in that each rod has near its two ends an elastic pivot having a comparatively low resistance to bending about an axis parallel to the X-direction and a comparatively high resistance to bending about an axis parallel to the Y-direction, while a central part having a comparatively high resistance to bending about axes parallel to the X-direction and the Y-direction is located between thw two elastic pivots.

A further embodiment of the positioning device, which has a comparatively stiff construction of the actuator, is characterized in that the actuator comprises an electric motor which is mounted on the second lower support and of which a driving shaft is coupled to an eccentric, while the first support is clamped between this eccentric and an end of a blade spring secured to the second support.

A still further embodiment of the positioning device, which permits comparatively rapid movements of the upper support parallel to the X- and Y-directions, is further characterized in that the first drive for the X-direction comprises a linear electric motor having an X-stator extending parallel to the X-direction and an X-translator displaceable along it and secured to the first upper support, while the X-stator is secured to two $Y_1$, $Y_2$-translators which are displaceable parallel to the Y-direction and are guided along $Y_1$- and $Y_2$ stators, respectively, extending parallel to the Y-direction, the said second drive for the Y-direction comprising both the $Y_1$-stator and $Y_1$-translator constituting a linear electric motor and the $Y_2$-stator and $Y_2$-translator also constituting a linear electric motor, said X-translator being displaceable parallel to the Z-direction with respect to the X-stator by means of the actuator and being guided for this purpose along the X-stator by means of rollers displaceable parallel to the Z-direction as rotatable about axes parallel to the Z-direction.

A still further embodiment of the positioning device, by which so-called accumulated tolerances are avoided, is characterized in that the first drive for the X-direction and the second drive for the Y-direction each have at least one translation rod which is displaceable parallel to the relevant coordinate direction (X, Y) and which is coupled by means of a magnetically pre-stressed aerostatic bearing to the first upper support, the magnetic pretension of the aerostatic bearing being larger than the maximum occurring pulling force between a translation rod and the upper support.

An optical lithographic device for the manufacture of integrated circuits, in which the properties of the positioning device used therein become manifest in a particular manner, is characterized in that an engagement surface for a substrate of the first support is arranged at right angles to an optical axis of a fixedly arranged optical projection lens coinciding with the Z-direction, said optical lithographic device comprising, viewed in the Z-direction, in order of succession the said positioning device and projection lens, a table for a mask that can be translated in the Z-direction and can be rotated about an axis of rotation parallel to the Z-direction, a condenser lens, a diaphragm, a shutter and a light source for repeatedly exposing the substrate.

The invention will be described more fully with reference to the drawing, in which.

Figure 1:
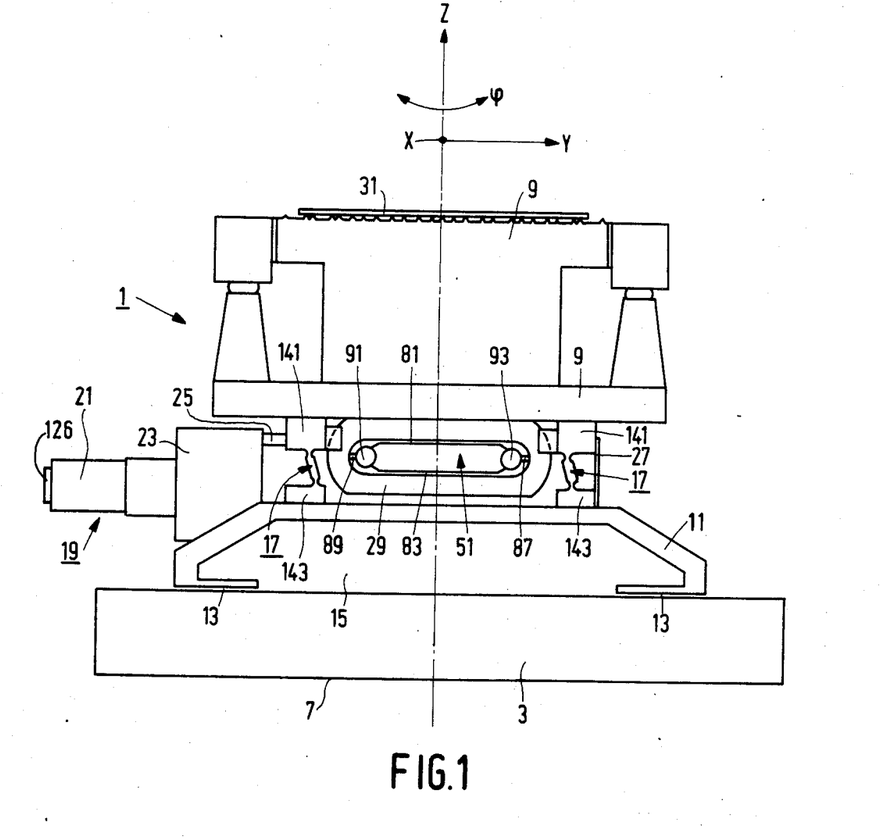
FIG. 1 shows diagrammatically a sectional view of a first embodiment of the positioning device.
Figure 2:
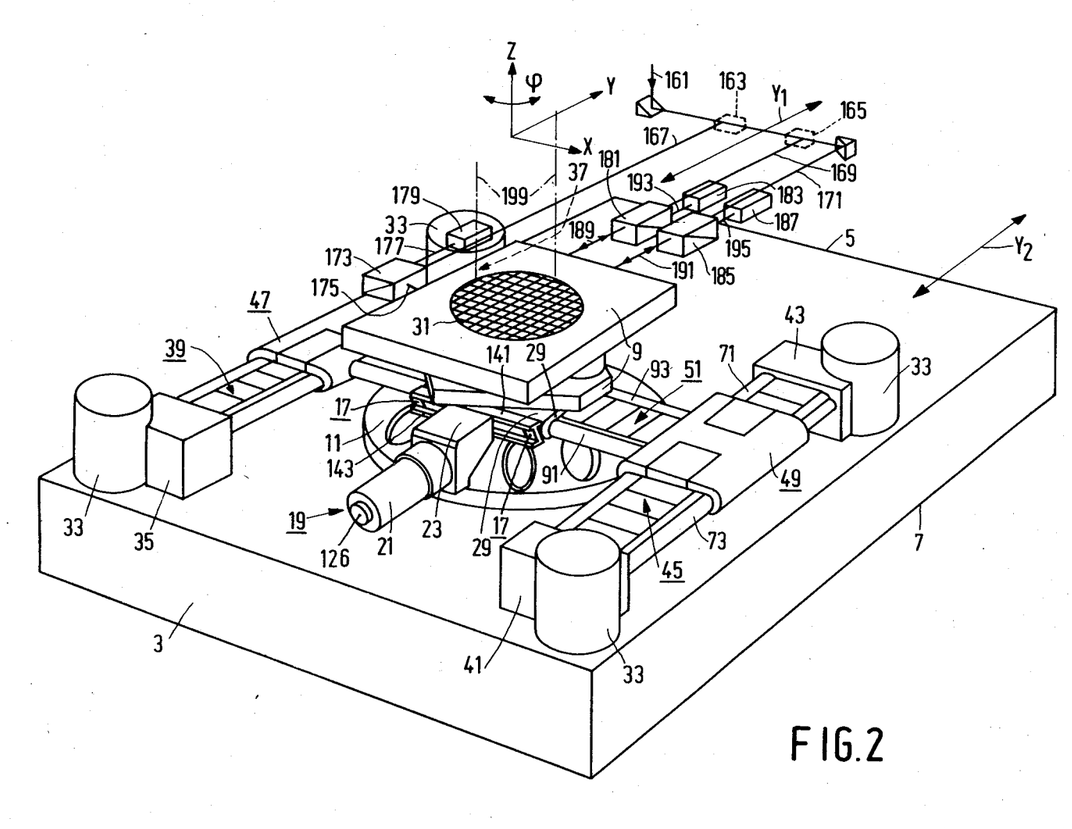
FIG. 2 is a perspective view of the positioning device shown in FIG. 1.
Figure 3:
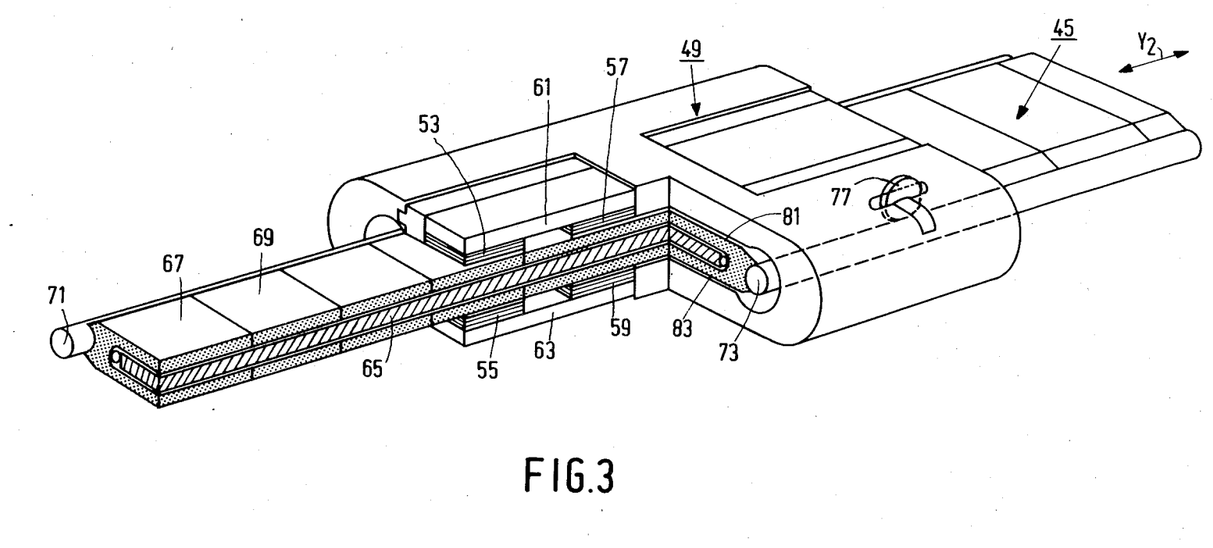
FIG. 3 is a perspective sectional view of a linear electric motor of the kind used in the positioning device shown in FIGS. 1 and 2.
Figure 5:
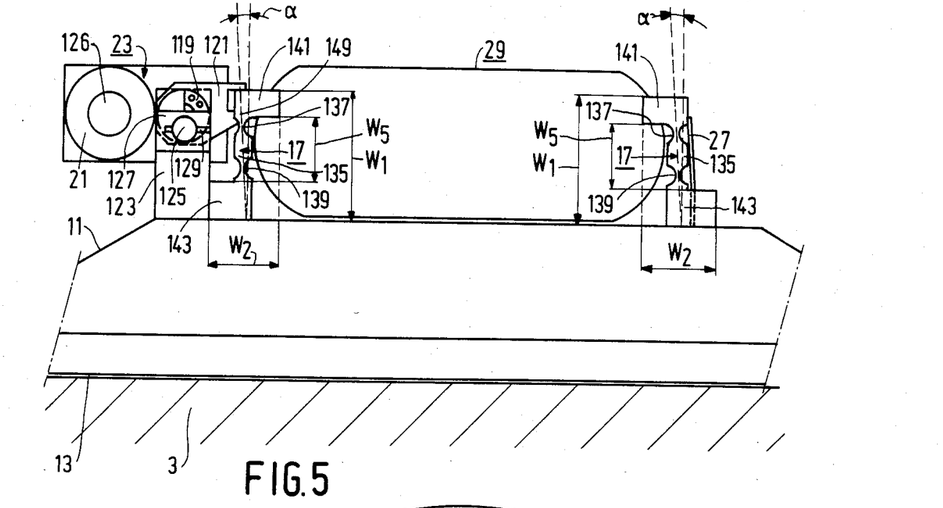
FIG. 5 is an elevation in the Y-direction of a drive used for displacement in the Z-direction in the positioning device shown in FIGS. 1 to 3.
Figure 6:
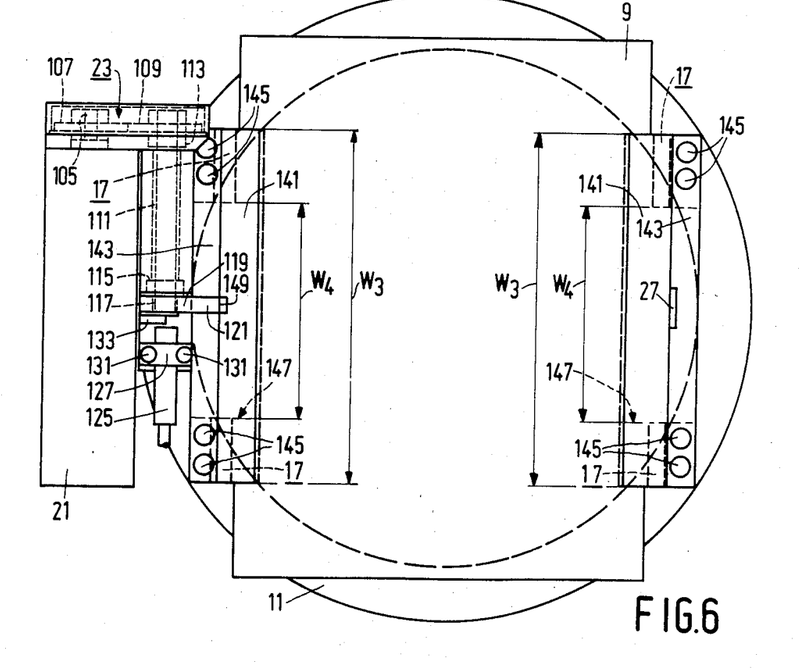
FIG. 6 is a plan view of the drive shown in Fig. 5.

The first embodiment of a positioning device 1 shown in FIG. 1 comprises a horizontally arranged plate-shaped base 3 of, for example, granite. The base 3 is provided with a very smoothly ground horizontal upper surface 5, which is substantially parallel to a lower surface 7. The upper surface 5 can be accurately levelled by means of adjustable feet (not shown) arranged below the lower surface 7. The positioning device comprises an upper first table-shaped support 9 and a lower second support 11, which is in the form of a so-called air foot. The second support 11 is guided and supported with respect to the base 3 by means of an air film 13. This air film 13 is maintained in a usual manner by means of a source of compressed air not shown for the sake of simplicity. The aerostatic bearing thus obtained is moreover of the pre-stressed type in order to obtain a sufficient stiffness. This is achieved in known manner in that a chamber 15 in the second support 11 is connected to a vacuum source (not shown). The first support 9 is coupled to the second support 11 by means of four rods 17 (only two rods 17 are shown in FIG. 1) acting as a parallelogram mechanism. With reference to FIGS. 5 and 6, it will be explained more fully hereinafter how the said parallelogram mechanism can be obtained in a simple manner. When the positioning device is considered to be arranged in a fixed orthogonal coordinate system X, Y, Z, the first support 9 can perform a relative displacement parallel to the Y-direction or Y-axis with respect to the second support 11 with a simultaneous elastic deformation of the rods 17. This displacement can be obtained by means of an actuator 19 secured to the second support. The actuator 19 comprises a direct current motor 21, of which an outgoing shaft is coupled via a reduction 23 to an eccentric 25 shown diagrammatically in FIG. 1. The first support 9 is effectively clamped between the eccentric 25 and the free end of a blade spring 27 secured to the second support 11. In the present case, a so-called translator 29 of a linear electric motor, which will be described more fully with reference to FIGS. 2 and 3, is provided for this purpose on the lower side of the table 9. Therefore, not the first support 9 itself, but the translator 29 secured thereto is clamped between the eccentric 25 and the blade spring 27. The positioning device is intended to cause an object 31 on the first support 9 to be displaced parallel to the X-, Y- and Z-directions. It will appear below that the device is particularly suitable for displacements in the submicron range. In the case in which as an object 31 a semiconductor substrate to be processed (exposed) is chosen, this substrate can be displaced with great accuracy with respect to an optical axis of an optical system used for repeatedly exposing the substrate. When integrated in a so-called lithographic device, the positioning device can consequently be used in the manufacture of integrated circuits. However, the positioning device is not limited at all to the said application.

Figure 4:
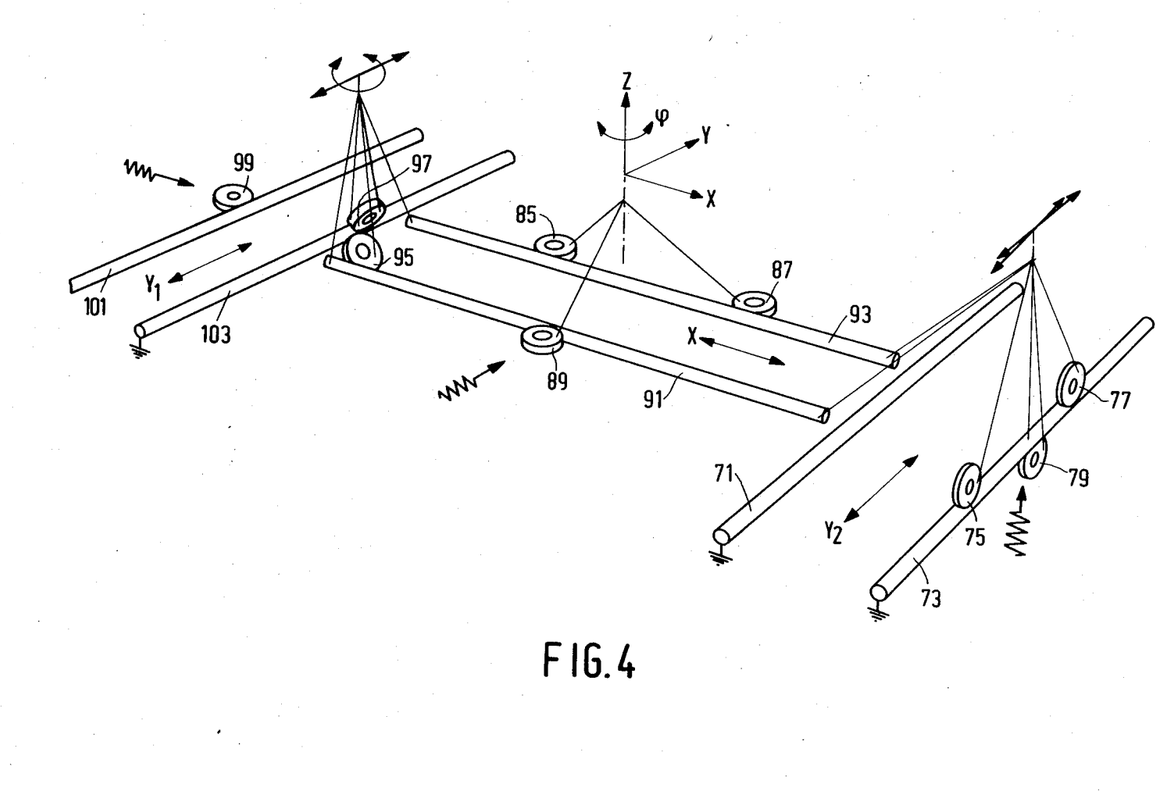
FIG. 4 shows diagrammatically a part of supporting and guiding means of the first support as used in the positioning device shown in FIGS. 1 to 3.

As appears from FIG. 2, the translator 29 (designated hereinafter as X-translator 29) forms part of an H-shaped system of drives with linear electric motors, which is known per se from the aforementioned magazine "De Constructeur". The positioning device or manipulator described in this magazine, however, is limited to X- and Y-movements. A rotation about an axis of rotation which is parallel to the Z-axis may be obtained by opposite energization of the linear motors destined for the Y-movements (corresponding to the directions $Y_1$ and $Y_2$ parallel to the Y-axis). On the base 3 are arranged four cylindrical columns 33, to which mounting blocks 35, 37 for a so-called $Y_1$-stator 39 and mounting blocks 41, 43 for a so-called $Y_2$-stator 45 are secured. The mounting block 37 located behind the first support 9 is indicated diagrammatically by a dotted arrow. By means of rollers to be described more fully with reference to FIGS. 3 and 4, a $Y_1$-translator 47 is guided over the $Y_1$-stator 39 and a $Y_2$-translator 49 is guided over the $Y_2$-stator 45. The $Y_1$-and $Y_2$ translators 47 and 49, respectively, are rigidly connected to a so-called X-stator 51, over which the X-translator 29 already mentioned above is guided by means of rollers. The stator-translator pairs 39–47, 45–49 and 51–29 constitute the linear electric motors (direct current motors) for the $Y_1$-, $Y_2$- and X-movements, respectively, of the first support 9. Although such linear electric motors are known per se, with reference to inter alia FIGS. 3 and 4 a further explanation of their construction will be given because for the Z-movement of the first support 9 use is made of the presence of the air gap between translator and stator in one of these motors, i.e. the X-motor. For the sake of simplicity, the explanation will be related to the linear motor for the $Y_2$-movement, as shown in FIG. 3.

In the $Y_2$-translator 49, which is made of aluminium, four pairs of permanent magnets are present, of which FIG. 3 shows in sectional view only two pairs of magnets 53, 55 and 57, 59. The magnets 53 and 57 are connected to each other by a soft iron yoke 61, while the magnets 55 and 59 are connected to each other by a soft iron yoke 63. The magnets 53, 55 and 57, 59, respectively, of a pair are oppositely arranged in the walls of the pipe-shaped $Y_2$-translator 49 and are located on either side of an elongate soft iron core 65, around which a series of coils 67, 69 etc. are wound. The magnets 53-59 are magnetized in a direction parallel to the Z-axis. The pair of magnets 53, 55 is magnetized in a direction opposite to the direction of magnetization of the pair of magnets 57, 59. Successive coils, such as the coils 67, 69 are wound in opposite senses. Cylindrical parallel rods 71 and 73 (cf. also FIG. 4) are located on either side of the $Y_2$-stator 45. The $Y_2$-translator 49 is guided by means of three rollers 75, 77 and 79, of which the roller 79 is resiliently arranged, along the rods 71 and 73 extending in the neutral position parallel to the Y-axis. The $Y_2$-translator 49 is provided with shafts (not shown), on which the rollers 75, 77 and 79 are rotatably journalled. In the neutral position of the first support 9, the $Y_2$-translator is arranged symmetrically to the $Y_2$-stator 45 so that two air gaps 81 and 83 of the same size (about 400 μm, in the direction of the Z-axis) are present on either side of the $Y_2$-stator 45. The X-translator 29 (cf. FIGS. 2 and 4) is guided in an analogous manner along the X-stator 51 by means of three rollers 85, 87 and 89, of which the roller 89 is resiliently arranged. For this purpose, the X-stator 51 is provided with cylindrical parallel rods 91 and 93, which in the neutral position extend parallel to the X-axis. The $Y_1$-translator 47 is also guided in an analogous manner along the $Y_1$-stator 39 by means of three rollers 95, 97 and 99, of which the roller 99 is resiliently arranged. For this purpose, the $Y_1$-stator 39 is provided with cylindrical parallel rods 101 and 103, which in the neutral position extend parallel to the Y-axis. The rollers 75, 77 and 79 are rotatable about horizontal axes, while the rollers 85, 87 and 89 and 99 are rotatable about vertical axes. It should be noted that the rollers 95 and 97 are rotatable about axes enclosing an angle of 45° with a horizontal plane at right angles to the Z-axis and are located in a vertical plane at right angles to the rods 101 and 103. The roller guides described of the three translators not only permit of causing the X-translator 29 to perform a small rotation (at most about ±8 millirad) about an axis of rotation ($\phi$) which is parallel to the Z-axis by energizing the $Y_1$-motor and the $Y_2$-motor in opposite senses, but also offer the possibility of displacing the X-translator 29 with respect to the X-stator 51 in a direction parallel to the Z-axis (in the present case over at most about ±15 μm). In the latter case, the X-stator 51 is also displaced over the same distance with respect to the second support 11 in a direction parallel to the Z-axis. It should be noted that the axis of rotation ($\phi$) coincides with the Z-axis only in the neutral position (cf. FIG. 2) of the support 9. In this neutral position, the centre line through the centre of the support 9 also coincides with the Z-axis. In all the remaining positions of the support 9, the axis of rotation ($\phi$) always means an arbitrary line parallel to the Z-axis and perpendicular to the upper surface of the support 9. If it is assumed that the first support 9 is displaced upwards from the neutral position, this means that of the air gaps 81 and 83 also present in the linear X-motor and having the same size the upper air gap 81 is enlarged and the lower air gap 83 is reduced. In the case of the vertical displacements of the first support 9 concerned here over at most about ±15 μm, the operation of the linear X-motor will not be adversely affected.

As appears from FIGS. 5 and 6, the direct current motor 21 has an outgoing shaft 105 which is coupled via a pair of toothed wheels 107 and 109 in the reduction 23 with a driving shaft 111. The driving shaft 111 supported in ball-bearings 113 and 115 is provided at its end remote from the ball-bearing 113 with an eccentrical sleeve 117, which fits with its outer circumference into the inner ring of a ball-bearing 119, whose outer ring fits into a circular hole of a yoke 121. The motor 21, the reduction 23 and the driving shaft 111 with its ball-bearings 113 and 115 are arranged on a mounting block 123, which is secured on the second support 11 (air foot). A position sensor 125 is secured on the mounting block 123 by means of a bracket 127, which is provided with a slit 129. This slit 129 serves to clamp the position sensor 125 by means of a screw connection 131 in the bracket 127. The position sensor is of the inductive type and is arranged opposite to a semi-circular metal vane 133, which is connected to the driving shaft 111. The position sensor 125 is used for the zero point adjustment of the eccentrical sleeve 117. Furthermore, the motor 21 is provided with a velocity sensor 126 (tacho). The elastically deformable rods 17 are formed by milling from metal blocks having a height W1, a width W2 and a length W3 The rods 17 have a comparatively stiff and thick central part 135 having on either side comparatively slack and thin end portions 137 and 139, which form the connection between the central part 135 and an upper beam 141 and a lower beam 143, respectively. The two upper beams 141 are secured by means of a screw connection (not shown) to the first support 9, while the two lower beam 143 are secured by means of screw connections 145 to the second support 11. The two metal blocks, from which each time two rods 17 (cf. FIG. 6) with an associated upper beam 141 and lower beam 143 are formed, are provided with rectangular holes 147 having a length W4 and a height W5 The rods 17 therefore have a width which is equal to $$\frac{W_3 - W_4}{2}$$

This width is sufficient to give the deformable end portions 137 and 139 of the rods 17 acting as elastic pivots a comparatively high resistance to bending about axes parallel to the Y-direction and a comparatively low resistance to bending about axes parallel to the X-direction. The rods 17 are moreover torsionally stiff. The lefthand and righthand upper beams 141 are clamped between the free end of the blade spring 27 secured in the relevant lower beam 143 and a nose 149 formed at the yoke 121. The blade spring 27 engaging with pretension at righthand upper beam 141 in the neutral position of the first support 9 and the X-translator 29 ensures a play-free drive. The connection line between the centres of the two end portions 137 and 139 of a rod 17 encloses an acute angle $\alpha$ with a line parallel to the Z-axis (cf. FIG. 5). Thus, it is achieved that already with a comparatively small displacement parallel to the Y-direction of the eccentric 25, of which the eccentrical sleeve 117 and the ball-bearing 119 form part, a comparatively large tilting movement of the rods 17 (or deformation of the end portions 137 and 139) and hence a comparatively large displacement of the first support 9 parallel to the Z-direction are obtained. It is assumed that upon energization of the electric motor 21 the first support 9 is held in the relevant X, Y position. This is described more fully hereinafter. In order to give an impression of the displacements concerned, it should be noted that with an eccentricity of 0.2 mm of the sleeve 117 and hence a stroke length of 0.4 mm of the nose 149, a displacement of the support 9 parallel to the Z-direction is obtained of ±15 μm. The associated values of the angle α are at most 5°25′ and at least 3°10′. In the neutral position with regard to the Z-direction, the angle α is equal to 4°20′. The value of α for this neutral position is determined by the sensitivity which is desired in the mechanical system. Due to the integral construction made in one piece of an upper beam 141, a lower beam 143 and two rods 17 on either side of the first support 9, a stable torsionally stiff supporting of the support 9 is obtained, which is frictionless, play-free and hysteresis-free. The construction additionally has a high resistance to tilting of the support 9 about axes parallel to the Y-direction. It should be noted that the central parts 135 of the four rods 17 have a comparatively high resistance to torsion and bending about axes parallel to the X-and Z-directions, while the end portions 137 and 139 have a comparatively high resistance to torsion and to bending about axes parallel to the Y-direction.

Figure 7:
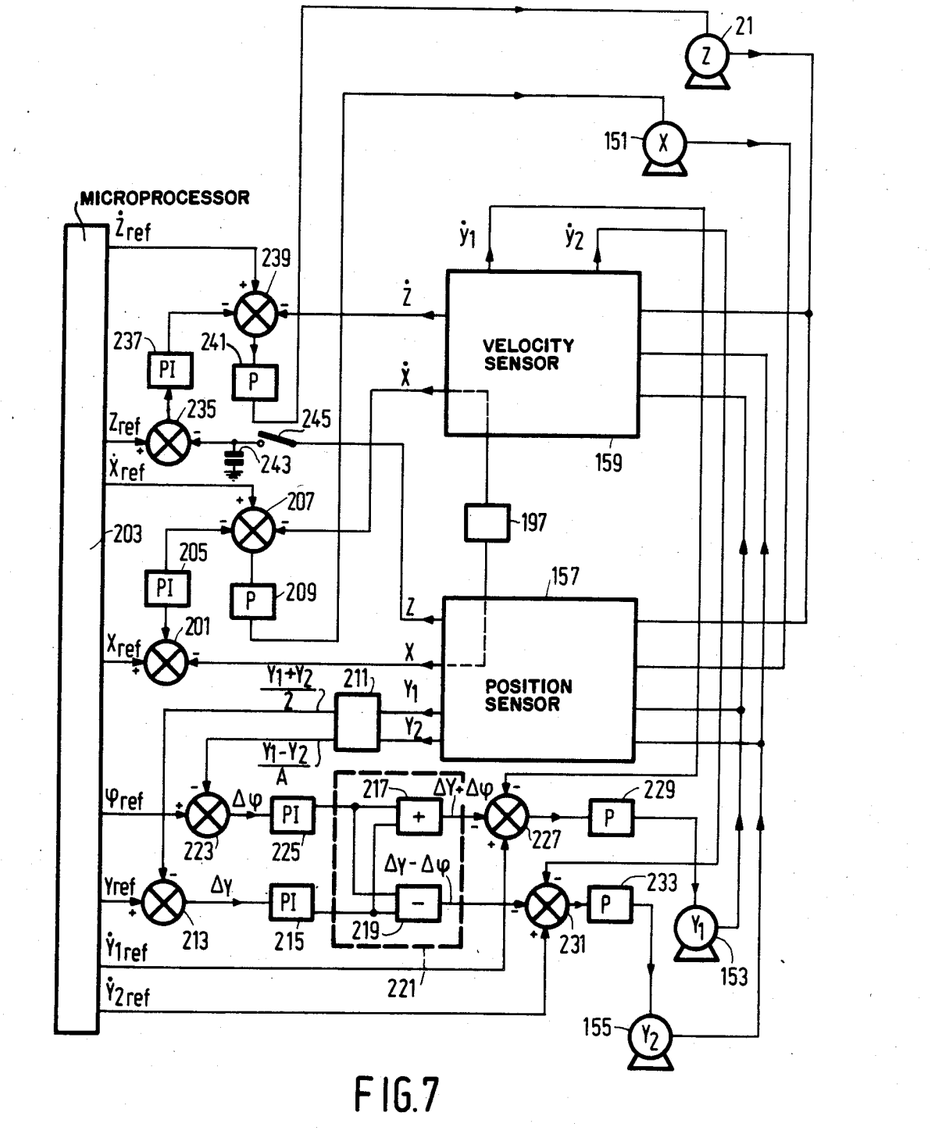
FIG. 7 shows a block circuit diagram of the servo controls used for the displacements in the X-, Y- and Z-directions of the first support.

Mainly with reference to FIGS. 2 and 7, the electric control of the positioning device will be described below. The control of the X-, $Y_1$-, $Y_2$- and Z-motors is effected by means of four servo systems each comprising a double servo loop. In the said first mode of operation of the Z-actuator constituted by the Z-motor (direct current motor 21) and the eccentric mechanism driven thereby, the first support 9 is displaced in the X- and/or Y-direction, the Z-motor 21 being used only for maintaining the last occupied Z-position. If desired, in the first mode of operation, a rotation ($\phi$) about a vertical axis may also be performed by a particular control of the $Y_1$- and $Y_2$-motors. In FIG. 7, the X-, $Y_1$- and $Y_2$-motors are denoted by reference numerals 151, 153 and 155, respectively. With reference to FIGS. 2 and 3, it has already been described how these linear motors are composed. The X- and Y-movements can take place both simultaneously and sequentially. In the said second mode of operation of the Z-actuator, in which the support 9 has reached its target position in the X- and Y-directions, a displacement parallel to the Z-axis is carried out. The support 9 is held for this purpose by means of the three control systems of the X-, $Y_1$- and $Y_2$-motors used for the X- and Y-displacements in the X,Y target. position. The Z-movement in the second mode of operation therefore never takes place simultaneously with the X- and/or Y-movements although in a phase which precedes the second mode of operation the X, Y and Z-movements may take place simultaneously. Starting point is the situation in which the support 9 has to be displaced to an X,Y target position in the first mode of operation of the Z-actuator before the support 9 in the second mode of operation of the Z-actuator is displaced to the desired Z-position by means of the Z-actuator. Essentially, it is of course possible to interchange, viewed in time, the first and the second modes of operation. This inter alia depends upon the field of use of the positioning device.

In the circuit diagram of the total control system shown in FIG. 7, a so-called position sensor block 157 and a so-called velocity sensor block 159 are provided. The block 157 represents the X-, $Y_1$-, $Y_2$- and Z-position sensors, while the block 159 represents the X-, $Y_1$-, $Y_2$- and Z-velocity sensors. The signals originating from the position means and from the velocity sensors, respectively, are indicated in FIG. 7 by X, $Y_1$, $Y_2$, Z and by $\dot{X}$, $\dot{Y}_1$, $\dot{Y}_2$ and $\dot{Z}$, respectively. All sensors are of a type known per se. The X-, $Y_1$- and $Y_2$-position sensors are laser interferometers, which utilize the same laser beam 161 (cf. FIG. 2). The laser beam 161 is split up by means of beam splitters 163 and 165 into a subbeam 167 for the X-sensor and subbeams 169 and 171 for the $Y_1$-sensor and the $Y_2$-sensor, respectively. The subbeam 167 is split up by means of a semi-transparent prism 173 into a reference beam (not shown) and an X-measuring beam 175. The measuring beam 175 is reflected by a side of the support 9 in the form of a mirror. The reflected measuring beam 175 interferes with the reference beam reflected on a reference mirror (not shown). The intensity of a so-called interference beam 177 thus produced is measured by a photocell in a receiver 179. The X-signal supplied by the receiver is a measure for the displacement of the support 9 parallel to the X-axis. The displacement parallel to the Y-axis is measured in a similar manner, but at two areas of the relevant side of the support 9 in the form of a mirror. The $Y_1$-signal is supplied by an arrangement comprising a semi-transparent prism 181 of the same type as the prism 173 and a receiver 183, while the $Y_2$-signal is supplied by an arrangement comprising a semi-transparent prism 185 of the same type as the prism 173 and a receiver 187. The $Y_1$ and $Y_2$-measuring beams are indicated in FIG. 2 by reference numerals 189 and 191, respectively, while the $Y_1$- and $Y_2$-interference beams are indicated by reference numerals 193 and 195, respectively. It should be noted that the measurement for the displacement parallel to the Y-axis is carried out at two areas in order that also a signal can be derived therefrom which is a measure for the rotation about an axis parallel to the Z-axis. When the sum of the $Y_1$- and $Y_2$-signals is halved, an average accurate signal of the Y-displacement is obtained, while, when the difference between the $Y_1$- and $Y_2$-signals is divided by a factor A (cf. FIG. 7), an accurate signal of the $\phi$ rotation is obtained. The factor A takes into account the influence of the fact that measurements are made at two areas of a side of the support 9, which are located at a considerable distance from the point of application of the driving Lorentz forces to the $Y_1$-translator 47 and the $Y_2$-translator 49 (cf. FIG. 2). The $\dot{x}$-velocity signal is derived by differentiation from the X-position signal by means of a differentiator 197 (cf. Fig. 7). The $\dot{Y}_1$- and $\dot{Y}_2$-velocity signals are obtained by means of known velocity sensors (tacho's), which are therefore not shown and which are coupled with the guide rollers of the $Y_1$-translator 47 and the $Y_2$-translator 49. The Z-position signal is obtained by means of an optical detection device indicated diagrammatically in FIG. 2 by reference numeral 199 and per se known from U.S. Pat. No. 4,356,392. It should be noted that the Z-signal may also be obtained by measuring the relative horizontal displacement between the first support 9 and the second support 11 by means of feelers on the two supports and by recalculating the measuring signal of these feelers into a Z-signal. Both sensor types may also be used for the Z-signal and the last-mentioned type may then be used for the zero point adjustment of the optical detection device. The Z-velocity signal is obtained by means of the speed sensor 126 (tacho) already described with reference to FIGS. 5 and 6.

As appears from FIG. 7, the X-signal is supplied to a comparator 201, which receives a reference signal $X_{ref}$ from a processor 203, for example a microprocessor. The comparator 201 supplies a difference signal to a PI controller 205, which prevents oscillations from being produced in the control loop. The output signal of the proportional integrating controller 205 is supplied to a comparator 207, which receives both the Ẋ-signal and a reference signal Ẋ$_{ref}$ from the processor 203. Through a P controller 209, the output signal of the comparator 207 is supplied to the X-motor 151. The double control loop or combined position/velocity loop for controlling the X-displacement described herein is of a type known per se, for example, from the aforementioned magazine "De Constructeur". The velocity loop integrated in the position loop is used inter alia to reach the target position without a so-called overshoot. The control thus becomes more rapid. The Y$_1$- and Y$_2$-signals are converted in a combined summation/subtraction circuit 211 into two output signals. One output signal $$(Y_1+Y_2)/2$$

of the circuit 211 represents the displacement of the support 9 parallel to the Y-axis, while the other output signal $(Y_1-Y_2)/A$ is a measure for the rotation ($\phi$) about an axis parallel to the Z-axis. The signal proportional to the Y-displacement $(Y_1+Y_2)/2$ is supplied to a comparator 213, which also receives a reference signal Y$_{ref}$ from the processor 203. The comparator 213 supplies a difference signal $\Delta Y$ to a PI controller 215, which is connected to an adder 217 and a subtractor 219 in a combined summation/subtraction circuit 221. The signal proportional to the $\phi$ rotation $(Y_1-Y_2)/A$ is supplied to a comparator 223, which also receives a reference signal $\phi_{ref}$ from the processor 203. The comparator 223 supplies a difference signal $\Delta\phi$ to a PI controller 225, which is also connected to the adder 217 and the subtractor 219 in the circuit 221. If no rotation ($\phi$) is desired, $\Delta\phi$ is equal to zero and the circuit 221 supplies two equal signals $\Delta Y$. The Y$_1$- and Y$_2$ motors then run at the same speed and in the same direction. If on the contrary a rotation ($\phi$) is desired, the circuit supplies an output signal and an output signal $\Delta Y$- $\Delta\phi$. The Y$_1$- and Y$_2$- motors now run with a different speed in the same direction or at the same speed in opposite directions. The output signal $\Delta Y+\Delta\phi$ corresponding to the Y$_1$-motor is supplied to a comparator 227, which also receives a reference signal Ẏ$_{1ref}$ from the processor 203 and a velocity signal Ẏ from the Y$_1$-velocity sensor. Via a P controller 229, the difference signal of the comparator 227 is supplied to the Y$_1$-motor 153. The output signal $\Delta Y-\Delta\phi$ corresponding to the Y$_2$-motor is supplied to a comparator 231, which also receives a reference signal Ẏ$_{2ref}$ from the processor 203 and a velocity signal Ẏ$_2$ from the Y$_2$-velocity sensor. Via a P controller 233, the difference signal of the comparator 231 is supplied to the Y$_2$ motor 155. The Z-signal is supplied to a comparator 235, which receives a reference signal Z$_{ref}$ from the processor 203. The comparator 235 supplies a difference signal to a PI controller 237. The output signal of the PI controller 237 is supplied to a comparator 239, which receives both the Ż-signal and the reference signal Ż$_{ref}$ from the processor 203. Via a P controller 241, the output signal of the comparator 239 is supplied to the Z-motor 21.

During the X-, Y-movements, the Z-position of the support 9 has to be maintained to the optimum. This is effected by holding the last-sensed Z-position and supplying it to the comparator 235, while the Z-position sensor (the optical detection device) is decoupled from the comparator 235 as long as the X,Y target position has not yet been reached. When, for example, a capacitor 243 and a switch 245 controlled by the processor 203 is included in the connection between the Z-position sensor and the comparator 235, this object may be achieved. Conversely, during the Z-movement the X,Y target position of the support 9 has to be maintained to the optimum. This is effected in the same manner as described above for the Z-position. For the sake of brevity, this is not indicated further in FIG. 7.

Figure 8:
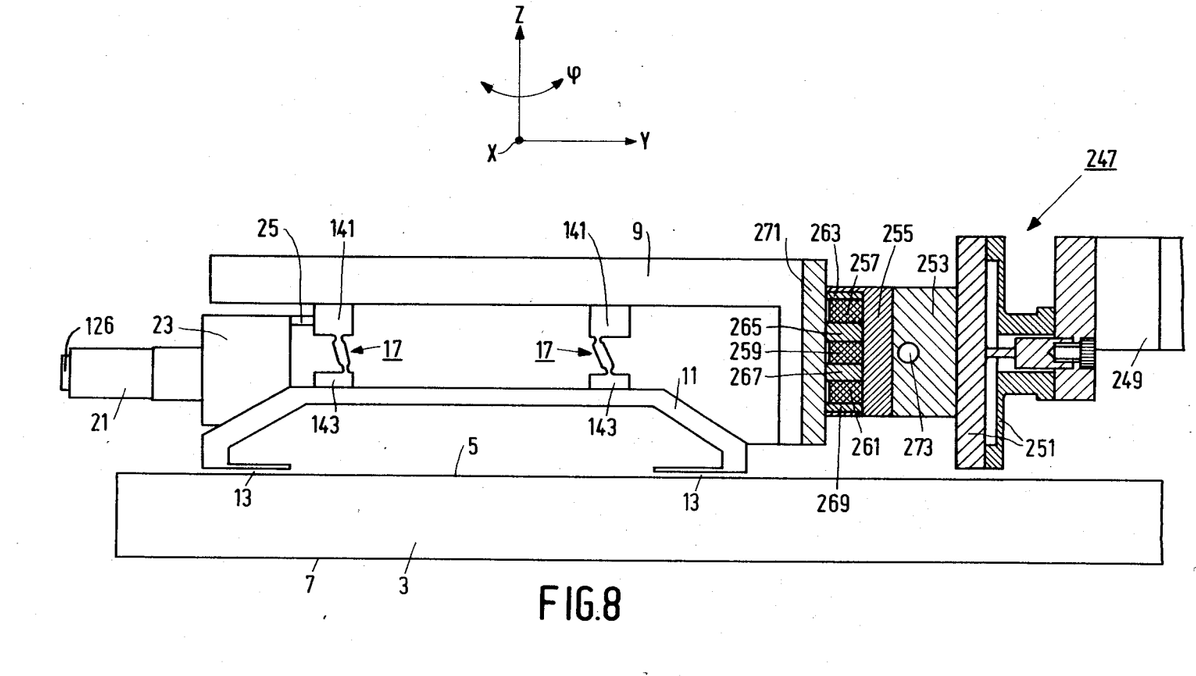
FIG. 8 shows diagrammatically a sectional view of a second embodiment of the positioning device.

The second embodiment of the positioning device shown in FIG. 8 is provided as far as possible with reference numerals corresponding to those of the first embodiment. The difference with the first embodiment resides in the different drives for the X- and Y-directions. The drive for the Z-direction is the same as described with reference to FIGS. 5 and 6. The electric control of the X-, Y- and Z-drives is of the same type as described with reference to FIG. 7. FIG. 8 only shows the drive for the Y-direction; that for the X-direction is identical thereto. If desired, an Y$_1$- as well as an Y$_2$-drive may be chosen. In this case, a rotation ($\phi$) of the support 9 about a vertical axis is possible in the manner described for the first embodiment. The Y-drive shown in FIG. 8 (and hence also the X-drive) is denoted by reference numeral 247. This drive is of a type proposed and described already in Netherlands Patent Application No. 8500930 and comprises a transation rod 249, which is displaceable, for example, by means of a friction transmission and is secured by means of an elastically deformable coupling member 251 to a block 253. The block 253 has secured to it a box 255 of a magnetically poorly conducting material, which accommodates three permanent magnets 257, 259 and 261, which are separated from each other by magnetically conducting yokes 263, 265, 267 and 269. The support 9 has secured to it a plate 271 of magnetically conducting material. The block 253 is provided with a supply 273 for compressed air, which merges into the air gap between the drive 247 and the plate 271. The aerostatic coupling (bearing) thus obtained is prestressed by the permanent magnets 257, 259 and 261 magnetized parallel to the Z-axis with a force exceeding the maximum occurring pulling force during operation between the drive 247 and the support 9. A particular advantage of the drive described is that a frictionless coupling is obtained between the driving element and the driven element. With respect to the first embodiment of the positioning device, the displacement in the Z-direction can be comparatively large because it is not limited by the admissible variation of the air gap in a linear motor. The possible displacement in the Z-direction is now mainly determined by the parallelogram mechanism of the rods 17.

Figure 9:
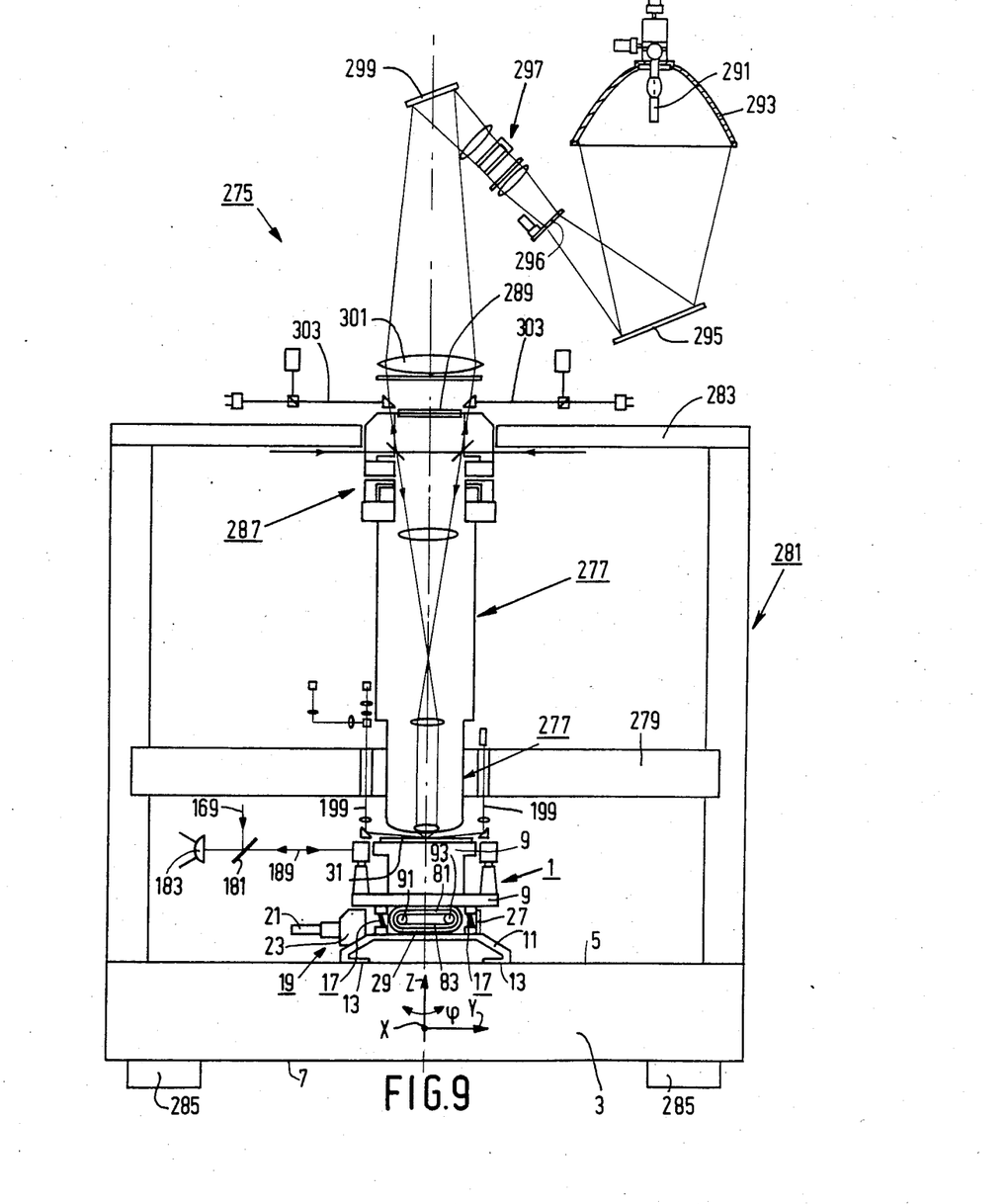
FIG. 9 shows diagrammatically an optical lithographic device according to the invention provided with a positioning device according to the invention.

The positioning device according to the invention described above with reference to two embodiments is particularly suitable for use in an optical lithographic device 275 according to the invention shown in FIG. 9 due to its frictionless, play-free and hysteresis-free construction. The device 275 shown in FIG. 9 is used in the manufacture of integrated circuits and in fact constitute a repeating optical projection system whose pièece de résistance is the support 9, by which an object 31 (semiconductor substrate) can be positioned in the X-, Y-, Z- and, as the case may be, $\phi$-directions. The columns 33 (cf. FIG. 2) not shown in FIG. 9 are mounted on the upper surface 5 of the granite plate 3. In FIG. 9, there is started from the use of the first embodiment of the positioning device in the optical lithographic device 275. With the use of the second embodiment described with reference to FIG. 8, the drive of the translation rod 247 is of course mounted on the granite plate 3. In the optical lithographic device 275, a projection lens 277 is provided, which is fixedly arranged with its lens holder in a socalled objective plate 279. This objective plate 279 forms part of a frame 281. The granite plate 3 and the upper plate 283 also form part of the frame 281. The plate 3 extending in a horizontal plane at right angles to the Z-axis is arranged on adjustable support members 285. The frame 281 is arranged so that the optical axis of the projection lens 277 coincides with the Z-axis. The equipment is further provided with a so-called Z-$\theta$ manipulator 287, which is proposed and described in Netherlands Patent Application No. 198 8600785. The manipulator 287 has an engagement member for a mask 289, which can be displaced parallel to the Z-axis with respect to the projection lens 277 and can be rotated about an axis of rotation $\theta$ coinciding with the Z-axis and the optical axis of the projection lens 277. The repeated exposure of the substrate 31 situated on the support 9 takes place in a number of different X,Y target positions of the support 9 with respect to the projection lens 277. For positioning the support 9 in the X,Y target positions, the interferometer system already described with reference to FIG. 2 is used. In each X,Y target position, the adjustment of the support 9 already explained then takes place parallel to the Z-axis. It should be noted that any $\phi$-adjustment of the support 9 may take place before or after the X,Y target positions are reached. Above the plate 283, a light source 291 with a parabolic reflector 293 is arranged. Via a mirror 295, a shutter 296, a diaphragm section 297, a mirror 299 and a condenser lens 301, the light is conducted to a mask 289. By means of the projection lens 277, the mask 289 is imaged on the substrate 31. The image of the mask 289 is focused on the srbstrate 31 by means of the optical detection device 199 known per se (cf. U.S. Pat. No. 4,356,392), which supplies the aforementioned Z-signal to the control system described with reference to FIG. 7. Both the mask 289 and the substrate 31 are provided with two alignment markers with, for example, X,Y gratings. These alignment markers serve to register or align the mask with respect to the substrate, use being made of an alignment system 303 already proposed and described in Netherlands Patent Application No. 8600639. The alignment system 303 detects when the alignment markers on the mask and on the substrate cover each other in projection, while the interferometer system for the X,Y target position (cf. FIG. 2) determines the extent of the horizontal displacements of the support 9 that were required thereto. From these data, both the required angle $\Delta\phi$ for alignment of the mask with respect to the substrate and the value of the relative translation parallel to the Z-axis of the mask and the lens required to obtain a correction enlargement are calculated. By means of the Z-$\theta$ manipulator 287, the mask 289 is then rotated with respect to the substrate about the axis of rotation $\theta$ (coincides with the Z-axis and also with the axis of rotation $\phi$ of the positioning device 1) and is translated parallel to the Z-axis until a perfect registration and a correct enlargement are obtained. Due to the fact that the positioning device according to the invention permits displacements as far as into the submicron range, it is particularly suitable for optical lithographic devices, in which such displacements are necessary.

The positioning device can generally be used for frictionless, play-free and hysteresis-free displacements of materials and objects to be examined and/or to be processed. In many cases, manipulations are then required in the X-, Y-, Z- and, as the case may be, the $\phi$-directions. It should be noted that the $\phi$-rotation described is not always required and that the three translations X, Y and Z may be sufficient. In these cases, the $Y_2$-motors and drives are superfluous. Such positioning devices also lie within the scope of the invention.

In the above description, the term "parallelogram mechanism" has been used with regard to the rods 17. Although the rods 17 described are locally elastically deformable at the area of the elastic pivots, blade spring-shaped or fully circular rods may also be employed. Such rods are also considered to be included by the term "parallelogram mechanism". In principle, the term "parallelogram mechanism" is used when parallel rod-shaped connection members between two bodies permit a displacement parallel to itself of one of these bodies by at least partial elastic deformation of the connection members.

WHAT IS CLAIMED IS:

1. A positioning device comprising a first upper and a second lower support, which are coupled to each other by means of at least two elastic rods acting together as a parallelogram mechanism, at least one support being displaceable parallel to itself with respect to the other support in a direction-parallel to one (Y) of two coordinate directions (X,Y) of an orthogonal coordinate system (X,Y,Z) with a simultaneous elastic deformation of the rods acting as a parallelogram mechanism, which rods have a comparatively high resistance to displacement of one of the supports with respect to the other support parallel to the X-direction, characterized in that the second lower support is supported by means of a static bearing prestressed parallel to the Z-direction and comprising a viscous carrier medium and is guided with respect to a base and is provided with a Z-actuator which cooperates with the first upper support, the upper support being displaceable in a first mode of operation of the Z-actuator by means of a first and a second drive, which is independent from the first drive, respectively, parallel to the X-direction and the Y-direction to an X-Y target position with a Z-position an activated Z-actuator, while the upper support in a second mode of operation of the Z-actuator is displaceable parallel to the Z-direction and is maintained in the said X-Y target position by the first and second drives during a displacement parallel to the Y-direction of the lower support with respect to the upper support.

2. A positioning device as claimed in Claim 1, characterized in that each rod has near its two ends an elastic pivot having a comparatively low resistance to bending about an axis parallel to the X-direction and a comparatively high resistance to bending about an axis parallel to the Y-direction, while a central part having a comparatively high resistance to bending about axes parallel to the X-direction and the Y-direction is located between the two elastic pivots.

3. A positioning device as claimed in Claim 1, characterized in that the actuator comprises an electric motor which is mounted on the second lower support and of which a driving shaft is coupled to an eccentric, while the first support is clamped between this eccentric and an end of a blade spring secured to the second support.

4. A positioning device as claimed in Claim 1, characterized in that the first drive for the X-direction comprises a linear electric motor having an X-stator extending parallel to the X-direction and an X-translator displaceable along it and secured to the first upper support, while the X-stator is secured to two $Y_1$, $Y_2$-translators which are displaceable parallel to the Y-direction and are guided along $Y_1$- and $Y_2$-stators, respectively, extending parallel to the Y- direction , the said second drive for the Y-direction comprising both the $Y_1$-stator and $Y_1$-translator constituting a linear electric motor and the $Y_2$-stator and $Y_2$-translator also constituting a linear electric motor, said X-translator being displaceable parallel to the Z-direction with respect to the X-stator by means of the actuator and being guided for this purpose along the X-stator by means of rollers displaceable parallel to the Z-direction and rotatable about axes parallel to the Z-direction.

5. A positioning device as claimed in claim 1, characterized in that the first drive for the X-direction and the second drive for the Y-direction each have at least one translation rod which is displaceable parallel to the relevant coordinate direction (X,Y) and which is coupled by means of a magnetically pre-stressed aerostatic bearing to the first upper support, the magnetic pretension of the aerostatic bearing being larger than the maximum occurring pulling force between a translation rod and the upper support.

6. An optical lithographic device for the manufacture of integrated circuits provided with a positioning device as claimed in claim 3, characterized in that an engagement surface for a substrate of the first support is arranged at right angles to an optical axis of a fixedly arranged optical projection lens coinciding with the Z-direction, said optical lithographic device comprising, viewed in the Z-direction, in order of succession the said positioning device and projection lens, a table for a mask that can be translated in the Z-direction and can be rotated about an axis of rotation parallel to the Z-direction, a condenser lens, a diaphragm, a shutter and a light source for repeatedly exposing the substrate.

* * * * *